United States Patent [19]

Panicker

[11] Patent Number: 5,089,881

[45] Date of Patent: * Feb. 18, 1992

[54] FINE-PITCH CHIP CARRIER

[75] Inventor: Ramachandra M. P. Panicker, Camarillo, Calif.

[73] Assignee: Micro Substrates, Inc., Camarillo, Calif.

[*] Notice: The portion of the term of this patent subsequent to Jul. 17, 2007 has been disclaimed.

[21] Appl. No.: 543,096

[22] Filed: Jun. 25, 1990

Related U.S. Application Data

[63] Continuation-in-part of Ser. No. 266,669, Nov. 3, 1988, Pat. No. 4,942,076.

[51] Int. Cl.$^5$ .................. H01L 23/54; H01L 23/14
[52] U.S. Cl. ........................ 357/80; 357/67; 357/74
[58] Field of Search ............ 357/80, 74, 67, 68; 437/203, 195, 192, 194, 246, 248; 174/262, 265, 266, 256, 257; 361/409, 410, 411, 412; 428/137, 209, 210, 432

[56] References Cited

U.S. PATENT DOCUMENTS

| | | | |
|---|---|---|---|
| 4,024,629 | 5/1977 | Lemoine et al. | 174/256 |
| 4,288,841 | 9/1981 | Gogel | 357/74 |
| 4,530,002 | 7/1985 | Kanai | 357/75 |
| 4,602,271 | 7/1986 | Dougherty, Jr. et al. | 357/80 |
| 4,680,618 | 7/1987 | Kuroda et al. | 357/67 |
| 4,698,663 | 10/1987 | Sugimoto et al. | 357/80 |
| 4,721,161 | 12/1987 | Pryor et al. | 174/256 |
| 4,721,995 | 1/1988 | Tanizawa | 357/80 |
| 4,861,641 | 8/1989 | Foster et al. | 428/137 |
| 4,933,741 | 6/1990 | Schroeder | 174/52.4 |
| 4,942,076 | 7/1990 | Panicker et al. | 428/137 |

FOREIGN PATENT DOCUMENTS 0145774  6/1987  Japan .................. 357/67

OTHER PUBLICATIONS

"Enhanced Transverse Via/Transtrip"-IBM Techical Disclosure Bulletin, vol. 29, No. 12, May 1987, pp. 5215-5216.

Primary Examiner—Rolf Hille
Assistant Examiner—S. V. Clark
Attorney, Agent, or Firm—John T. Matlago

[57] ABSTRACT

A fine-pitch pin grid array for mounting an IC chip having a number of signal, ground and power contact pads thereon comprises a square as-fired ceramic substrate having a corresponding number of signal, ground and power metal filled vias located on the side portions of the surface thereof. Deposited on the surface of the substrate is a thin-film metallization which includes a corresponding number of signal, ground and power bonding pads located on the sides of the central portion thereof and further includes conductive traces which provide for connecting each signal metal filled via to a signal bonding pad. Deposited over the thin-film metallization is a multilayer circuit which includes a first dielectric layer having a low dielectric constant, a ground metal layer, a second dielectric layer having a high dielectric constant, and a power metal layer. The ground metal layer is used to commonly connect the ground metal filled vias to the ground bonding pads. The power metal layer is used to commonly connect the power metal filled vias to the power bonding pads. The ground and power layers and the intervening second dielectric layer further function as an integrated decoupling capacitor. Moreover, the ground layer further functions to control the impedance of the signal conductive traces.

15 Claims, 6 Drawing Sheets

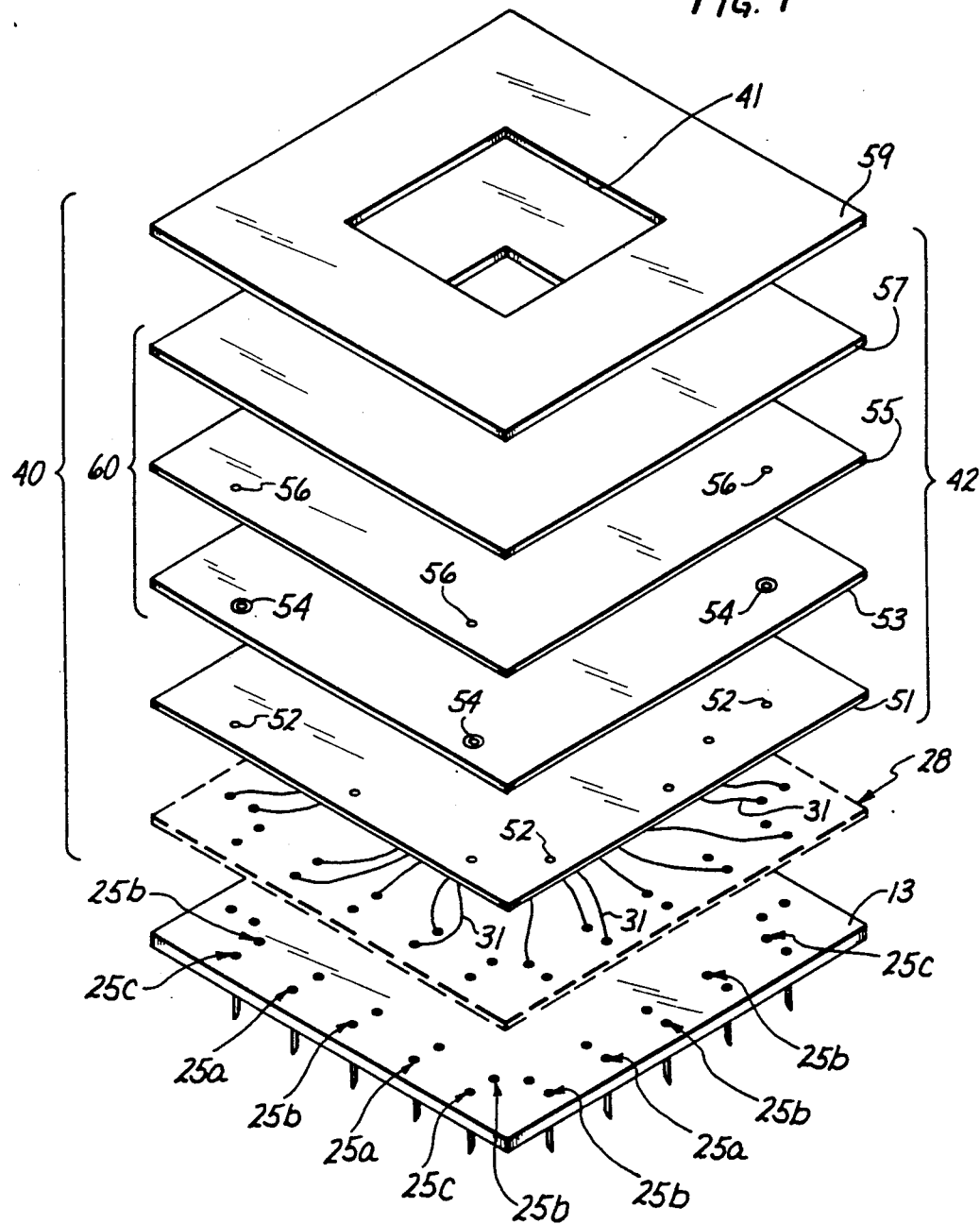

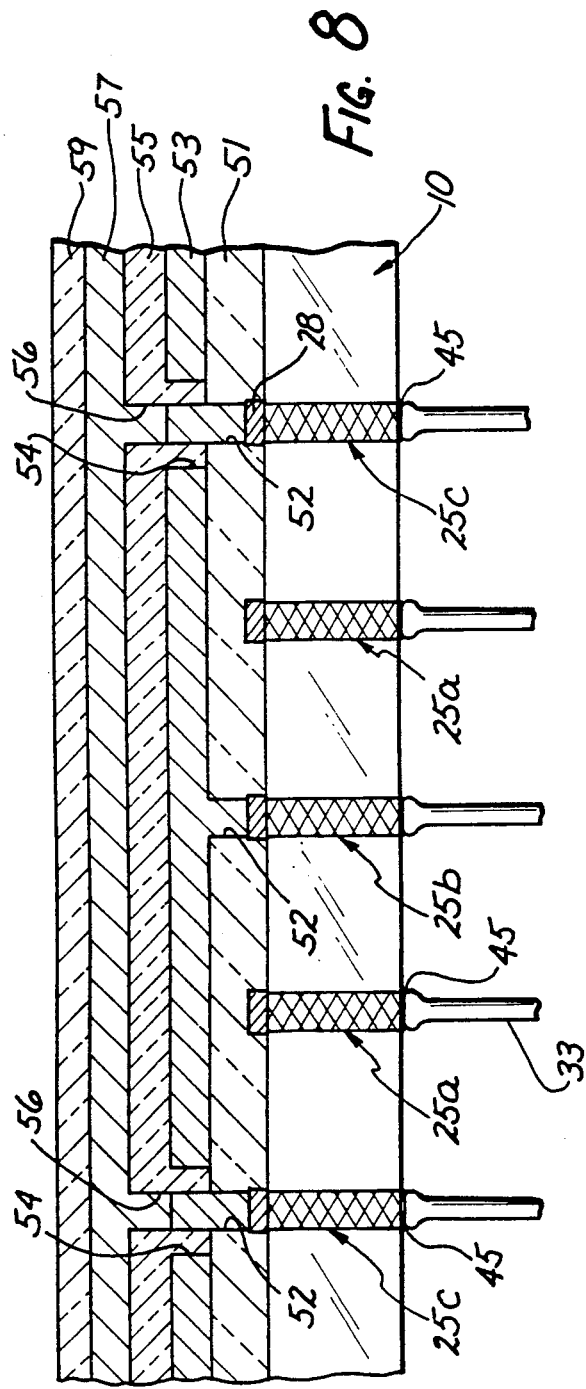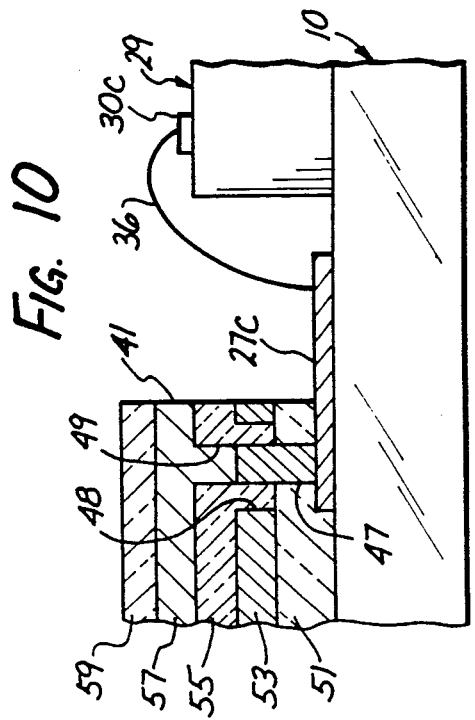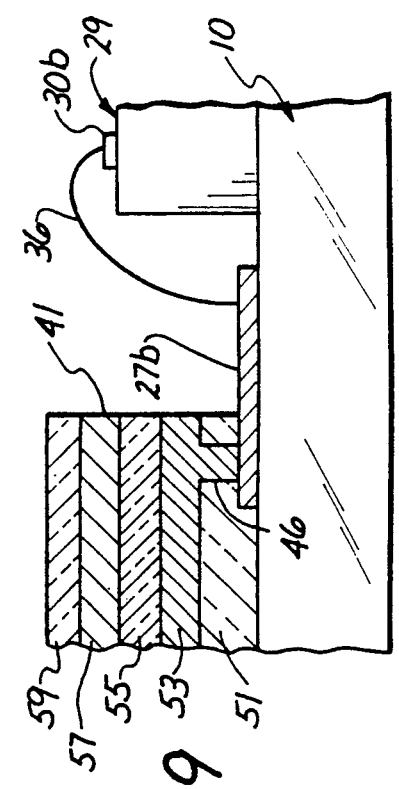

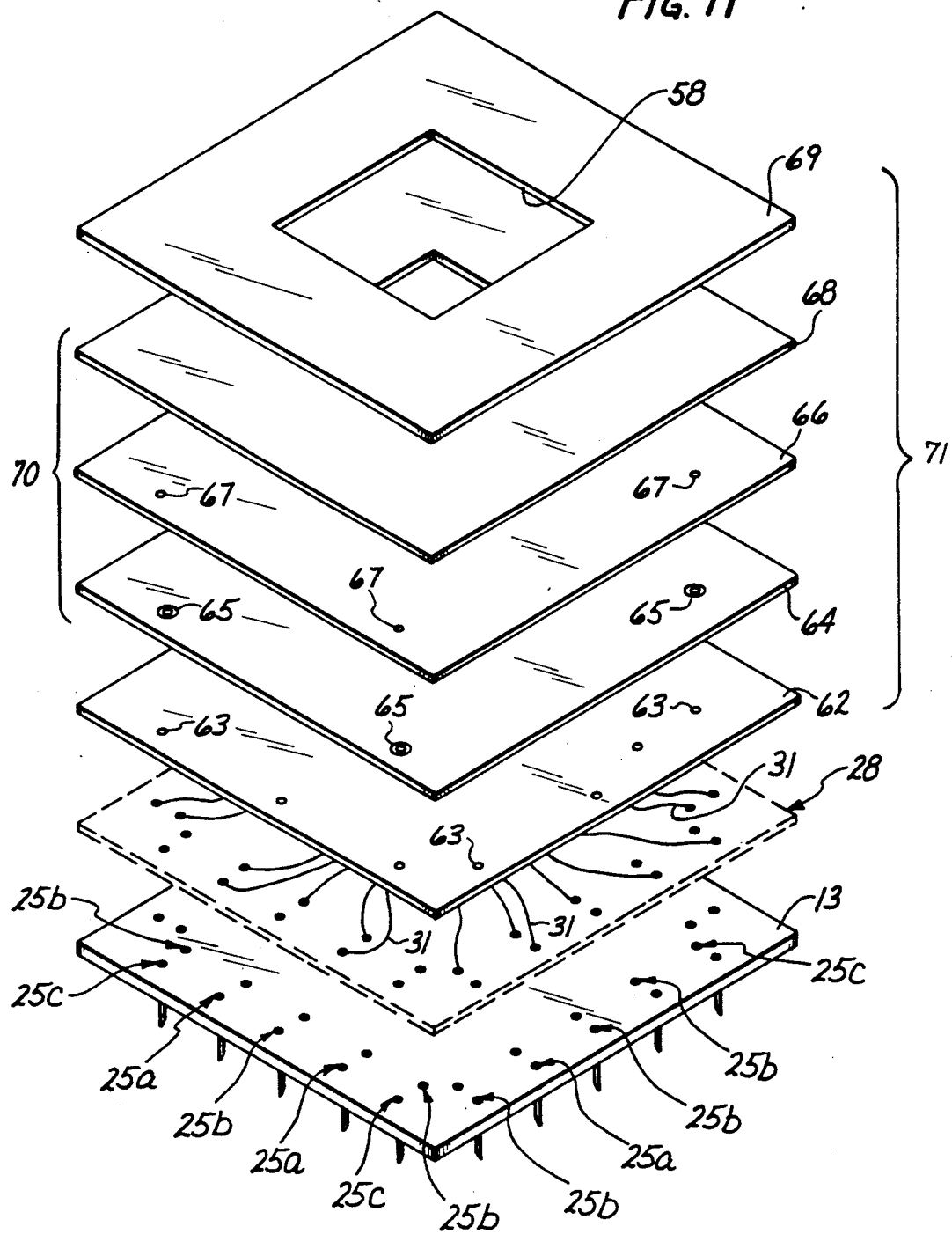

FINE-PITCH CHIP CARRIER

CROSS-REFERENCE TO RELATED APPLICATION

This application is a continuation-in-part of application Ser. No. 266,669 filed Nov. 3, 1988, now U.S. Pat. No. 4,942,076.

BACKGROUND OF THE INVENTION

In the construction of a pin grid array in the prior art for use in packaging an IC chip to enable it to be connected to a printed circuit board, it is customary to provide a multilayer structure fabricated by use of cofired technology. Such a multilayer structure is typically formed from a dozen or more individual green ceramic layers including a bottom layer provided with a plurality of via holes filled with tungsten paste and a top layer screen printed with tungsten paste to provide bonding pads thereon. Each of the layers also has its upper surface screen printed with tungsten paste to provide conductive paths thereon. Moreover, each of the upper layers is provided with interlevel vias filled with tungsten paste and located for electrically interconnecting the conductive paths on the successive layers and, therefore, each of the tungsten filled vias on the bottom layer to one of the bonding pads on the top layer. These individual green ceramic layers are stacked, laminated under pressure and cofired to create a monolithic structure. Pins are then brazed to the ends of the tungsten filled vias on the lower surface of the bottom layer and an IC chip is mounted with contact pads on the face thereof wire bonded to the bonding pads on the top layer.

In its continued effort to make digital processors smaller, faster and more powerful, the industry finds that the above cofired construction of a pin grid array for providing connections between an IC chip and a printed circuit board has many disadvantages. Among these is that the shrinkage of the green ceramic layers when cofired throws off the registration of the tungsten filled vias on the bottom layer and the interlevel tungsten filled vias on the upper layers relative to the locations of the conductive paths provided on the upper surfaces of the respective layers as needed to electrically interconnect the pins on the bottom layer to the bonding pads provided on the top layer. Thus, because of the lack of registration, the areas of the tungsten pads that are provided on the surfaces of the respective layers to interconnect the interlevel tungsten filled vias have to be made larger thereby taking up space on each of the surfaces so that a lesser number of conductive paths can be laid down thereon. This requires many ceramic layers on the multilayer structure to provide for depositing all the connecting paths needed between the bottom pins and the top bonding pads for an IC chip, especially when the IC chip has a large number of inputs and outputs.

Another reason that requires the multilayer structure to have even more ceramic layers is because, when a cofired process is used, the conductive paths are formed with a tungsten paste and the lengths of the interconnecting conductive paths are very long. As a result, the electrical resistance of these conductive paths between the pins and the bonding pads is very high. In order to minimize the resistance it is necessary to widen the tungsten paths and this takes up space and further reduces the density by which the conductive paths can be laid down. Now this widening of the tungsten conductive paths to minimize their resistance has a further deleterious effect on the electrical performance of the pin grid array. This is because of the need to provide the larger area pads on the ends of the tungsten conductive paths to enable them to connect to the interlevel tungsten filled vias which have lost their registration due to the shrinkage of the green ceramic layers when cofired. Such large area pads add interlayer capacitance which slows down the speed of operation of the pin grid array so that the IC chip mounted thereon cannot be operated at the high speed for which it was designed. It should now be clear that a pin grid array used as a carrier for a high density, high speed IC chip cannot be practically provided by the cofiring process.

SUMMARY OF THE INVENTION

In accordance with the present invention, a dimensionally stable electrically insulating substrate card for a pin grid array has a plurality of precisely positioned via holes thereon. The majority of these via holes are designated as signal via holes, and the remainder thereof are designated as ground via holes and power via holes. An IC chip for mounting on the substrate card has a plurality of contact pads thereon that relate to the via holes in that a corresponding majority number thereof are designated as signal contact pads, and a corresponding remainder thereof are designated as ground contact pads and power contact pads. Each of the via holes on the substrate card is hermetically filled with a composite formed of a mixture of a refractory metal and a lower melting metal having a high electrical and thermal conductivity. A single layer of thin-film metallization is provided on the upper surface of the substrate card by use of the photolithographic process to include a pattern of bonding pads that surround the central area on the surface of the substrate card on which the IC chip is to be mounted. It should be noted that a bonding pad is provided for each of the signal, ground and power contact pads provided on the IC chip. The single layer of the thin-film metallization further includes a pattern of closely positioned conductive traces for connecting each of the signal metal filled vias on the substrate card to one of the signal bonding pads. A multilayer circuit of thick-film metallization is provided over the single layer of the thin-film metallization on the upper surface of the substrate card. The multilayer thick-film metallization include a first dielectric layer having a low dielectric k constant, a ground metal layer, a second dielectric layer having a high dielectric k constant, a power metal layer, and finally a passivation layer. The ground metal filled vias on the substrate card are extended through the first dielectric layer so as to contact the ground metal layer. The power metal filled vias are extended through the first dielectric layer, through the ground metal layer without contacting it, and through the second dielectric layer so as to contact the power metal layer. In addition, the ground metal layer is connected to each ground bonding pad by filling a via provided in the first dielectric layer above the outer end portion of each ground bonding pad at the time the ground metal layer is deposited. Furthermore, the power metal layer is connected to each power bonding pad by filling a via provided in the first dielectric layer above the outer portion of each power bonding pad at the time the ground metal layer is deposited, and further extending each of these metal filled vias through the ground metal layer without contacting it and on through the second dielectric layer so as to contact the power metal layer.

The ground and power metal layers with the dielectric layer having a high k constant therebetween function as an integrated decoupling capacitor for reducing the noise on the ground and power distribution networks to the pin grin array packaged IC chip. Moreover, the locating of the ground metal layer above the first dielectric layer deposited over the closely positioned thin-film conductive traces on the substrate card provides for controlling the impedance of these traces which are being used to transfer signals between the packaged IC chip and the outside world.

Another embodiment of the pin grid array of the present invention provides for the layers of the multilayer circuit located above the thin-film metallization on the surface of the substrate card to be deposited by the use of thin-film technology.

Accordingly, one of the objects of the present invention is to provide a novel structure for a pin grid array.

Another object is to provide a fine-pitch, fast operating, inexpensive pin grid array for use in mounting an IC chip on a printed circuit board.

Another object is to provide for minimizing the impedance of the interconnecting paths provide for a pin grid array so that the signals can be transferred therethrough at a speed that is compatible with the designed speed of operation of an IC chip.

Another object is to provide extremely clean power and ground potentials for an IC chip by forming an integrated decoupling capacitor by using a dielectric material with a high k constant between the ground and power layers of the metallization provided on a substrate for connecting the ground and power pins provided on the substrate to ground and power contact pads on the IC chip.

Another object is to provide an inexpensive fine-pitch IC chip carrier which uses thin-film technology for laying down closely positioned conductive traces with a controlled impedance on a substrate surface for connecting signal pins to signal contact pads on an IC chip by way of metal filled vias on the substrate and which uses thick-film technology for laying down ground and power layers and an intervening dielectric layer with a high k constant for connecting ground and power pins to ground and power contact pads on the IC chip by way of metal filled via on the substrate.

These and other objects, features and advantages of the present invention will be made more readily apparent from the following detailed description of the preferred embodiment as illustrated in the accompanying drawings.

BRIEF DESCRIPTION OF THE DRAWINGS

FIG. 7 is an exploded perspective view of the successive layers of thick-film metallization deposited over the signal thin-film metallization provided on the surface of the substrate FIG. 8 illustrates an enlarged diagrammatic sectional view of the structure in FIG. 6 as taken along line 8—8 thereof;

FIG. 9 illustrates an enlarged diagrammatic sectional view of the structure in FIG. 6 as taken along line 9—9 thereof;

FIG. 10 illustrates an enlarged diagrammatic sectional view of the structure in FIG. 6 as taken along line 10—10 thereof; and FIG. 11 is an exploded perspective view of the alternate successive layers of thin-film metallization deposited over the signal thin-film metallization provided on the surface of the substrate.

DESCRIPTION OF THE PREFERRED EMBODIMENT

Figure 1:
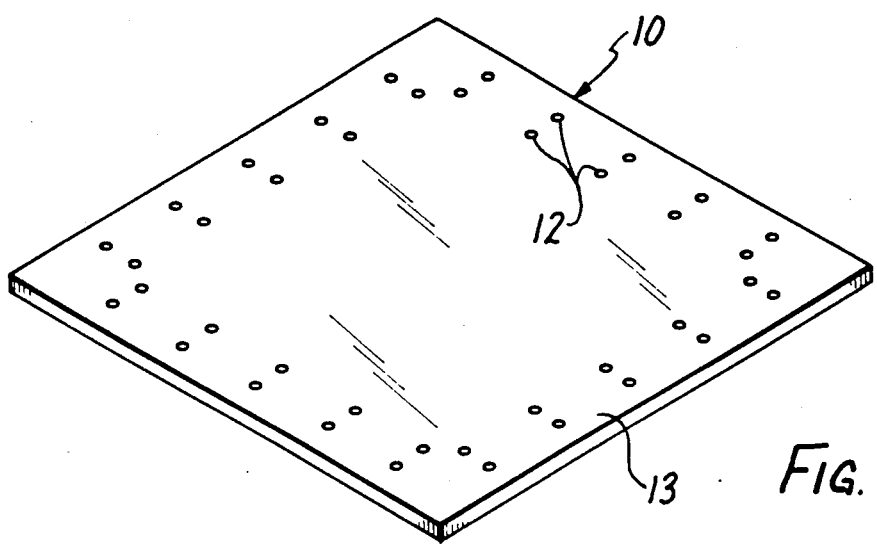
FIG. 1 is a top perspective view of an as-fired ceramic substrate provided with rows of precisely positioned via holes on the side portions of the surface thereof in accordance with the present invention.

Reference will first be made to FIG. 1 which is a top perspective view of a ceramic substrate card 10 as provided for the present invention. The substrate card 10 may typically be a square 1×1 inch sheet of as-fired alumina having a thickness of approximately 0.03 inch. The substrate card 10 is shown with two rows of five via holes 12 on each side portion of the surface thereof. It should be appreciated that although only ten via holes 12 are shown on each side portion of the substrate card 10 for the purpose of disclosing the invention, as many as 100 or more via holes can be provided on each side portion thereof. Thus, the via holes 12, which may each be, for example, 10 mils in diameter and provided with a pitch that can be as fine as 25 mils, are drilled on the substrate card 10 by use of a numerically controlled laser with an accuracy that is within one thousandths of an inch of their specified location relative to the other via holes thereon.

A disclosure of the steps of the process used for placing a composite metal in each of the via holes 12 on the substrate card 10 will next be presented by reference to FIGS. 2a-2g.

Figure 2A:
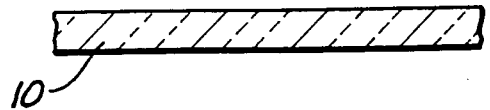
FIG. 2a-2g are cross-sections of a portion of the substrate in FIG. 1 showing successive steps of the process for providing composite metal filling in the via holes thereof.
Figure 2B:
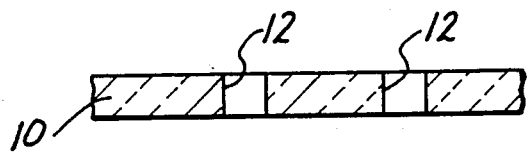

Thus FIG. 2a illustrates a portion of the as-fired alumina sheet which is used as the starting material for the substrate card 10. FIG. 2b shows two of the via holes 12 provided on the substrate.

Figure 2C:
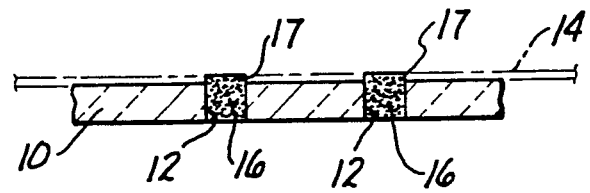

As shown in FIG. 2c, a stencil 14, indicated by phantom lines, which is about 2 mils thick and has a pattern of holes located thereon identical to the pattern of via holes 12 that are drilled on the substrate card 10 is placed over the upper surface of the substrate card, such that their respective holes are aligned. A first paste 16 made of tungsten particles and a binder is then squeegeed, i.e., pressed, through the holes of the stencil 14 so as to fill all of the via holes 12 on the substrate card 10.

As evident by the showing in FIG. 2c, upon the removal of stencil 14, a small protrusion 17 of the tungsten paste equal to the thickness of the stencil extends above each of the via holes 12 on the substrate card.

Figure 2D:
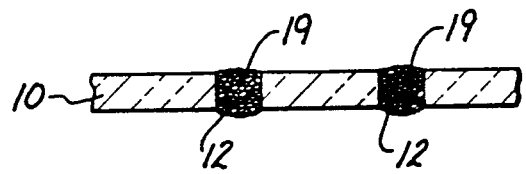
Figure 2E:
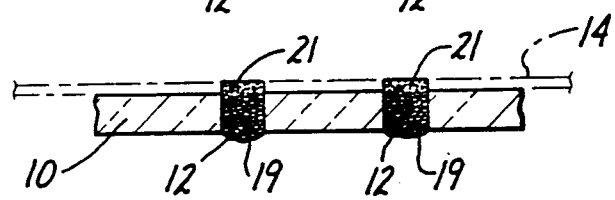

Substrate card 10 with the tungsten paste 16 in each of the via holes thereof is then sintered at about 1375° C. for about 15 to 20 minutes in a furnace having a controlled reducing atmosphere comprised preferably of a mixture of hydrogen and nitrogen. This causes the binder on the paste 16 to burn off and leave a porous mass of sintered tungsten 19 in each of the via holes, as shown in FIG. 2d. Note that the small protrusion 17 of tungsten paste above each via hole in FIG. 2c is reduced due to the shrinkage of the tungsten paste caused by the burn-off of its binder during sintering. It should be especially noted that the amount of binder chosen to be in the tungsten paste 17, upon being burned off, results in the sintered tungsten 19 having about 15% porosity. It should be further noted that by increasing or decreasing the amount of binder in the tungsten paste 16 the porosity of the sintered tungsten 19 can be controlled to vary between 10% to 20%.

Figure 2F:
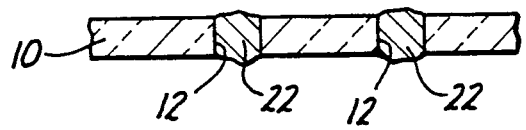

As shown in FIG. 2e, the stencil 14 is again placed over the substrate card 10 with its holes aligned with the via holes 12 thereof. Then a second paste 21 made of copper particles with a binder is squeegeed, i.e., pressed, into all of the holes of the stencil 14 so as to lie on the top of the porous mass of sintered tungsten 19 in each of the via holes 12. It should be noted that particles of a metal such as copper are used in the second paste 21 because copper has a high thermal and electrical conductivity and a relatively low melting point. Thus, upon now heating the substrate card 10 to about 1150° C. for about 10 minutes in a reflow furnace having a controlled atmosphere comprised of a mixture of hydrogen and nitrogen, the binder of the copper paste 21 is burned off and the copper particles are heated to a molten mass which enables the copper to be infiltrated, i.e., effectively drawn by surface tension into the pores of the sintered tungsten 19. As a result, the mixture of metal in each of the via holes 12 ends up as shown in FIG. 2f, in the form of a solid composite metal mass 22 comprised of a mixture by volume of about 85% tungsten and 15% copper to form Cu/W filled vias 25.

Figure 2G:
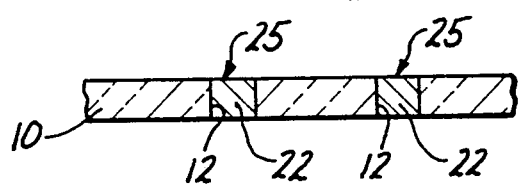

As shown in FIG. 2g, after the composite mixture of tungsten and copper is formed in each of the via holes, the top and bottom surfaces of the alumina substrate card 10 are lapped and polished to eliminate any excess of the solid mass of the metal (See FIG. 2f) present on the top and bottom surfaces of the Cu/W filled vias 25.

Figure 3:
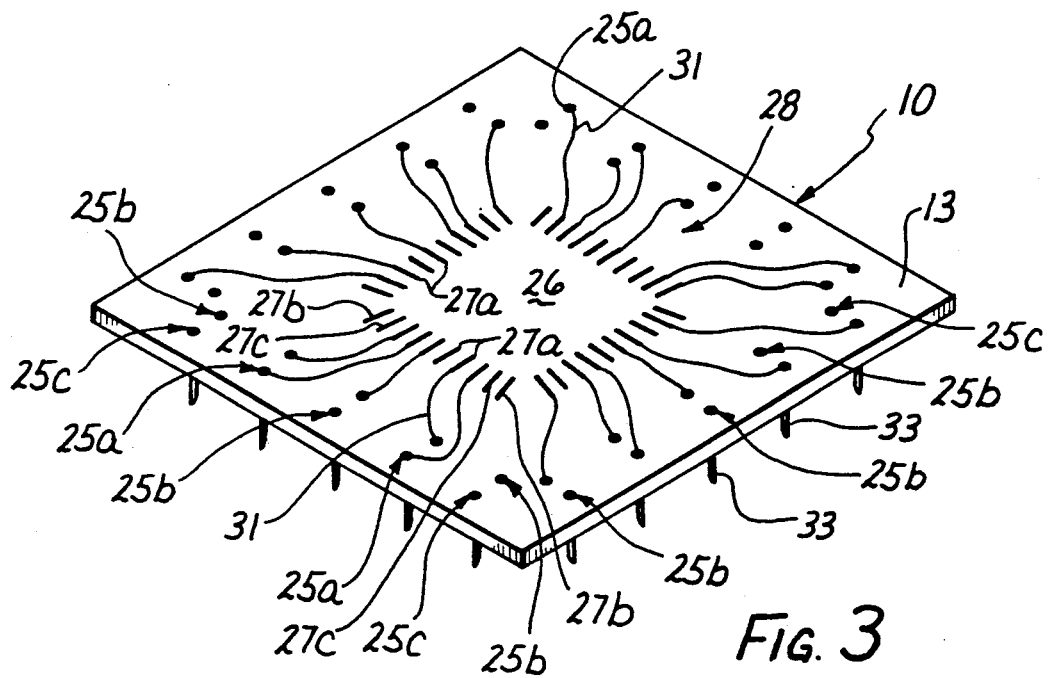
FIG. 3 is a top perspective view of the substrate with metal filled vias showing the thin-film metallization pattern provided on the top surface thereof.

Reference will next be made to FIG. 3 which is a top perspective view of the substrate card 10 with the Cu/W filled vias thereon. It should be appreciated that of the total number of Cu/W filled vias provided on a typical pin grid array about 75% are used for signal connections and the remaining are used for the ground and power connections. In order to clearly explain how the pin grid array of the present invention is constructed, hereinafter specific ones of the Cu/W filled vias 25 used for signal connections are designated 25a, those used for ground connections are designated 25b, and those used for power connections are designated 25c.

As further shown in FIG. 3, a pattern of thin-film metallization 28 of copper or gold is sputtered on the top surface 13 of substrate card 10. This thin-film metallization 28 includes ten fingers or elongated bonding pads 27 on each side of the central square area 26 provided on the top surface 13. As noted in FIG. 3, the signal bonding pads are designated 27a, the ground bonding pads are designated 27b and the power bonding pads are designated 27c. In addition, the thin-film metallization 28 includes closely positioned conductive paths or traces 31 connecting each of the Cu/W filled vias designated 25a on each side portion of the central square area 26 on the substrate card to one of the bonding pads 27a on the same side portion thereof. It should be especially noted that by use of the present invention which employs a highly precise positioning of the via holes on an as-fired ceramic substrate, it is possible to sputter the traces 31 on the surface of the substrate card with thin-film technology to have a width of 1-2 mils and to have a pitch of about 4 mils. With such reduced line widths for the traces 31, it is necessary to sputter them with high conductivity metal such as copper or gold to minimize their resistance and it is also necessary to provide a ground reference plane.

Figure 5:
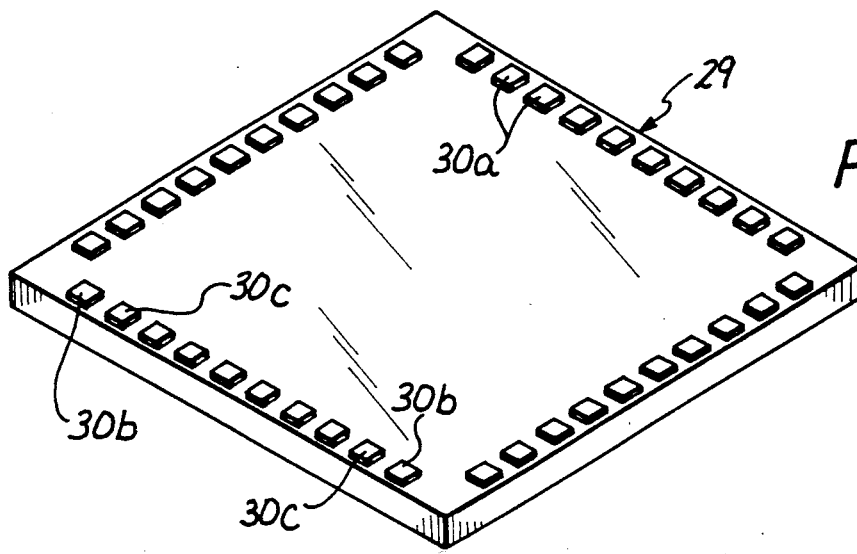
FIG. 5 is a top perspective view of an IC chip showing the contact pads provided on the sides of the face thereof.

An enlarged perspective view of an IC chip 29 for mounting on the central area 26 of the substrate card 10 is shown in FIG. 5. The IC chip is provided on each side of the face thereof with ten contact pads which include signal contact pads 30a, ground contact pads 30b and power contact pads 30c.

Figure 4:
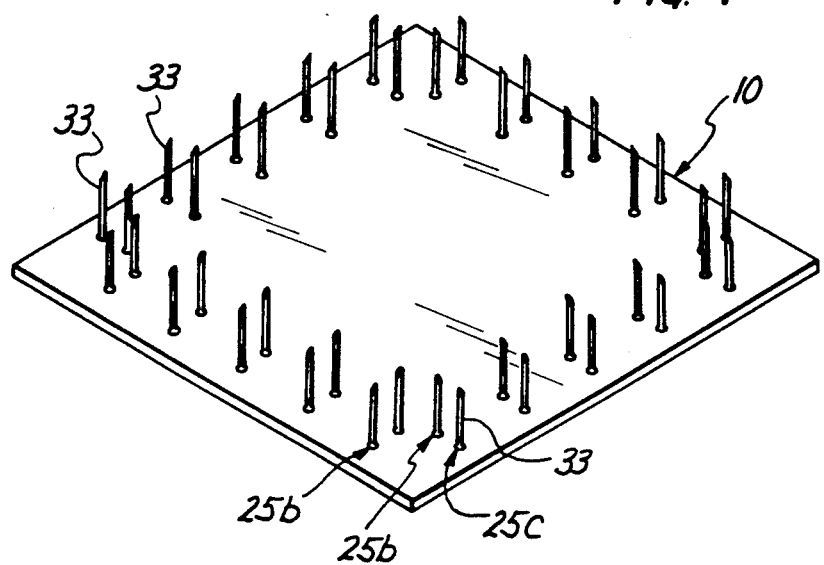
FIG. 4 is a bottom perspective view of the substrate in FIG. 3 showing pins brazed to the bottom ends of the metal filled vias thereon.
Figure 6:
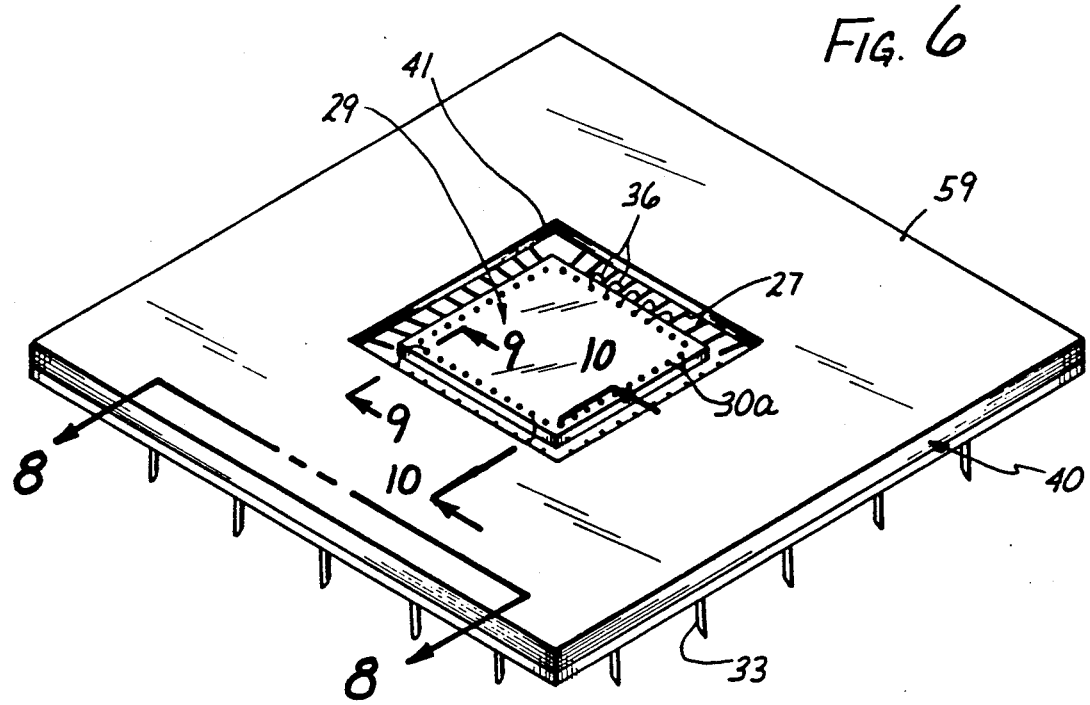
FIG. 6 is a top perspective view of the substrate in FIG. 3 showing the multilayer circuit including the thin-film and thick-film metallization provided on the side surface portions thereof and an IC chip mounted on the central portion thereof.

Reference will next be made to FIG. 6 which is a perspective top view of the substrate card 10 with the pins 33 brazed on the ends of the Cu/W filled vias on the bottom surface thereof (FIG. 4). In addition, FIG. 6 shows, in block form, a multilayer circuit 40 which comprises the single layer of thin-film metallization 28 (FIG. 3) that is deposited on the top surface 13 of the substrate card 10 and a multilayer thick-film metallization 42 (FIG. 7) that is deposited over the single layer of thin-film metallization 28 and extends inwardly so as to cover the outer half portions of the elongated bonding pads generally designated 27. The IC chip 29 is also shown mounted on the square central area 26 on the top surface 13 thereof with its contact pads 30a, 30b and 30c, respectively, connected by wire bondings 36 to the bonding pads 27a, 27b and 27c included in the thin-film metallization 28 (FIG. 3). It should be noted that because of the preciseness with which the thin-film bonding pads can be laid down with a pitch that matches that of the contact pads on the IC chip 29, it is possible to mount the IC chip by the use of Tape Automated Bonding (TAB) techniques or as a flipchip. Moreover, although pins 53 are illustrated as being brazed to the bottom ends of the Cu/W filled vias 25 on the substrate card, as well known in the art contacting pads (not shown) may be attached to the bottom of each of the Cu/W filled vias for use in connecting the inputs and outputs of the packaged IC chip to a printed circuit board.

Reference will next be made to FIG. 7 which shows a top perspective view of the successive layers comprising the multilayer circuit 40 exploded away from the top surface 13 of the substrate card. It should be appreciated that although only the two front side portions of the top surface 13 of the substrate card 10 and the top surfaces of the successive layers of the multilayer circuit 40 are shown in FIG. 7, the connections for the Cu/W filled vias 25a, 25b and 25c on the two back side portions of the respective top surfaces of the layers of the metallization are provided in a similar manner. Thus, the first layer shown is the sputtered thin-film metallization 28 which includes the plurality of elongated bonding pads, generally designated 27, deposited on each side of the central area 26 thereof (FIG. 3), the metal deposited over each of the Cu/W filled vias, generally designated 25, and the traces, i.e., the conductive paths 31, deposited so as to provide the shortest possible path between the metal deposited on each of the Cu/W filled vias 25a and the outer end each of the elongated bonding pads 27a.

The remaining successive layers of the multilayer circuit 40 provided on the top surface 13 of the substrate card comprise the successive five layers of the thick-film metallization 42. It should be appreciated that an advantage of providing the remaining successive layers as thick-film is that it is less expensive to lay down a thick-film metallization which can be used in this setting because there are a fewer number of ground and power Cu/W filled vias that have to be handled and so the precision with which these remaining layers need to be laid down is no longer critical.

Thus, as shown in FIG. 7, above the thin-film metallization 28 on the substrate card, a first thick-film dielectric layer 51 formed of a paste comprised of a glass having a low dielectric constant k equal to about 8 is screen printed by use of conventional thick-film metallization techniques. The dielectric layer 51 is deposited over the thin-film metallization 28 provided on the side surface portions of the substrate card (FIG. 6) being reserved for the multilayer circuitry 40 and extends inwardly to cover approximately half of the elongated bonding pads 27 provided on the sides of the square central area 26 thereof. This includes the use of a first screen (not shown) having a polymer located thereon so as to block off the area above each of the ground and power Cu/W filled vias 25b and 25c when the first dielectric layer 51 is deposited. This leaves contact holes 52 in the first dielectric layer 51 that are aligned with each of the vias being used for ground and power connections.

A ground metal layer 53 formed of a copper paste, for example, is then screen printed over the first dielectric layer 51 by use of conventional thick-film metallization techniques. This includes the use of a second screen (not shown) which is formed with polymer located to block off an annular opening 54 about each of the Cu/W filled vias 25c used for power connections. The Cu/W filled vias 25b used for the ground connections terminate by contacting the ground plane 52.

A second dielectric layer 55 formed of a paste comprised of $BaT_iO_3$ and glass and having a high dielectric constant k equal to 100 or more is then screen printed over the ground plane 53 by use of conventional thick-film metallization techniques. This includes the use of a third screen (not shown) having a polymer located thereon so as to block off each of the power Cu/W filled vias 25c and thereby leave contact holes 56 in the second dielectric layer 55 that are aligned with each of the Cu/W filled vias 25c being used for power connections.

A power metal layer 57 formed of a copper paste is then screen printed over the second dielectric layer 55 by use of conventional thick-film metallization techniques. The Cu/W filled vias 25c used for power connections terminate by contacting the power layer 57.

Finally, an overglaze or passivation layer 59 which may be the same dielectric paste used for the first dielectric layer 51 is screen printed by use of conventional thick-film metallization techniques to cover the power layer 57. It should now be clear that a square central opening 41, as best shown in FIG. 7 for the passivation layer 59, is formed in each of the thick-film layers so as to provide access to the exposed central area 26 of the substrate card 10 on which IC chip 29 is mounted, as shown in FIG. 6.

Reference will next be made to FIG. 8 which shows an enlarged diagrammatic cross-section of the assembled pin grid array as taken along line 8—8 of FIG. 6 which cuts through the first row of Cu/W filled vias provided on one side of the substrate card. Note that pins 33 are brazed to thin-films 45 of Ti/W/Ni plated on the ends of the vias.

As previously described in connection with FIG. 3, and as shown in FIG. 8, the thin-film metallization layer 28 is sputtered over the side portions of the top surface of substrate card 10 to cover the area above each of the signal, ground and power vias, designated as 25a, 25b and 25c, respectively. Moreover, as previously described in connection with FIG. 3, traces 31 are provided which connect each of the signal vias 25a to one of the signal bonding pads 27a provided on the corresponding side of the central area 26 of the substrate card surface.

As shown in FIG. 8, the signal vias 25a provided with traces 31 are terminated at the thin-film layer 28 but all the remaining vias on the substrate card which comprise the power vias 25b and 25c, respectively, are made to extend upwardly through contact holes 52 provided in the first dielectric layer 51. Note that when the ground metal layer 53 is screen printed the contact holes 52 are filled and the ground vias 25b are terminated. Moreover, annular openings 54 are provided in the ground metal layer about each of the power Cu/W filled vias 25c that are being extended. Next, the second dielectric layer 55 is shown screen printed so as to fill the annular openings 54 provided on the ground metal layer about the vias 25c so as to insulate them therefrom. In addition, contact holes 56 are shown provided in the second dielectric layer 56 above the power vias 25c so as to further extend them. Next, the power layer 57 formed of a copper paste is shown screen printed so as to fill the contact holes 56 in the second dielectric layer 55 with copper paste while covering the entire remaining area of layer 55 surrounding the central area 26 (FIG. 3) thereby terminating the power vias 25c. The passivation layer 59 is then shown deposited above the power layer 57.

Reference will next be made to FIGS. 9 and 10 which show how the ground metal layer 53 and the power metal layer 57, to which the ground vias 25b and the power vias 25c are respectively connected are, in turn, respectively connected to the ground bonding pads 27b and the power bonding pads 27c that are deposited on the top surface of the substrate card 10.

Thus, as shown in FIG. 9, at the time the first thick-film dielectric layer 51 is deposited, a contact hole or via 46 is formed thereon above the outer portion of the round bonding pads 27b (FIG. 3). Thus, when the ground metal layer 53 is deposited over the dielectric layer 51, it fills each of the vias 46 and connects the ground metal layer 53 to each of the ground bonding pads 27b. As shown, a wire bonding 36 connects the inner end of each ground bonding pad 27b to a contact pad 30b on the top surface of the IC chip 29.

As shown, in FIG. 10, at the time the first thick-film dielectric layer 51 is deposited, a contact hole or via 47 is also formed therein above the outer portion of each of the power bonding pads 27c. Thus, when the ground metal layer 53 is deposited over the dielectric layer 51, each of the vias 47 is filled and an annular opening 48 is formed about each extended metal filled via 47. At the time the second thick-film dielectric layer 55 is deposited, it fills the annular openings 48 in the ground layer 53 so as to insulate the extended metal filled via 47 and a via 49 is formed therein above each of the extended metal filled vias 47. Thus, when the power metal layer 57 is deposited, it fills each of the vias 49 such as to further extend the metal filled vias 47 and thereby connects the power metal layer to each of the power bonding pads 27c. As shown, a wire bonding 36 connects the inner end of each power bonding pad 27c to a contact pad 30c on the top surface of the IC chip 29.

There are certain applications when it may be advantageous to lay down all the layers of the multilayer circuit, deposited over the thin-film metallization 28 provided on the substrate card, by the use of thin-film technology. In these cases, as shown in FIG. 11, a first thin-film dielectric layer 62 is deposited over the thin-film metallization 28 so as to extend inwardly to cover approximately half of the elongated bonding pads 27 FIG. 3). This thin-film dielectric layer 62 is made of a polymer such as Benzocycle Butane having a thickness of 2 to 50 microns and a k constant of between 2.5 to 3.5. Since the area opposite each of the ground and power vias 25b and 25c which is to be extended is now covered by the first dielectric layer 62, it is necessary to pattern it using conventional thin-film technology which includes the use of a photoresist and a photolithographic mask to provide contact holes 63 therethrough that are aligned with each of the ground and power vias. A thin-film ground metal layer 64 made of copper, gold or aluminum having a thickness of 0.5 to 25 microns is then deposited over the thin-film dielectric layer 62 so as to cover the first dielectric layer 62 and fill all the contact holes 63. As a result, the ground vias 25b are extended so that they contact the thin-film ground metal layer 64. This ground metal layer 64 is then patterned using conventional thin-film techniques that include the use of a photoresist and a photolithographic mask to provide an annular opening 65 in the ground layer 64 about each of the extended power vias 26c. A second thin-film dielectric layer 66 is then deposited over the thin-film ground layer 64. This thin-film dielectric layer 66 is made, for example of $Ta_2O_5$ having a thickness of 0.2 to microns and a k constant equal to about 25. Since the area opposite each of the power vias 25c which is to be extended is now covered by the second dielectric layer 66, it is necessary to pattern it using conventional thin-film technology which includes use of a photoresist and a photolithographic mask to provide contact holes 67 therethrough that are aligned with each of the extended power vias 25c. Following this, a thin-film power metal layer 68 made of copper, gold or aluminum and having a thickness of 0.5 to 25 microns is deposited over the high k constant dielectric layer 66 so as to fill the contact holes 67 therein and cover the remainder of the side areas of the substrate card 10 being reserved for the multilayer circuitry 71. A passivation thin-film layer 69 that may be made of the same material used for the first thin-film dielectric layer 62 is then deposited over the power layer 68.

In the alternate thin-film embodiment shown in FIG. 11, the ground and power metal layers 64 and 68 of the multilayer circuitry 71 are respectively connected to the ground and power bonding pads 27b and 27c by metal filled aligned vias (not shown) that are provided in the intervening layers in a manner similar to the thick-film embodiment of the multilayer circuit 42 shown in FIGS. 9 and 10.

It should be pointed out that it is well known in the art to provide a decoupling capacitor in a system using a pin grid array so that the levels of the digital signals that are being transferred between the input/output pins 33 on the substrate card and the contact pads 30 of the IC chip are kept constant within a certain range. The prior art does not, however, provide a decoupling capacitor for this purpose on the pin grid array. Instead, it goes outside the pin grid array to the printed circuit board on which the pin grid array is mounted to provide a decoupling chip capacitor. The disadvantage of the prior art approach is that it places the decoupling capacitor too far away from the conductive paths which are desired to be controlled. The closer a decoupling capacitor is to the conductive paths on the pin grid array the better and more effective it is. It is for this reason that the present invention makes use of the ground and power metal layers 53 and 57 (FIG. 7), for example, on the pin grid array together with a high k constant dielectric layer 55 therebetween to form the integrated decoupling capacitor 60. It should be noted that this decoupling capacitor 60 is positioned on the pin grid array above the signal traces 31, being separated therefrom only by the low k constant dielectric layer 51. Thus, the decoupling capacitor 60 does not take up any more space on the substrate card, or on the printed circuit board on which the pin grid array is mounted, and further eliminates the need for wire bonding a chip capacitor or providing a discrete capacitor on the printed circuit board, as in conventional prior art packaging.

The providing of an integrated decoupling capacitor, in this manner, on a pin grid array is especially useful since it provides for cleaner power and ground levels which get to be more of a problem as the number of I/O contact pads on an IC chip increases and the speed (clock rate) thereof increases, thereby increasing the simultaneous switching noise.

It should be further pointed out that the depositing of the ground metal layer 53 above the first low k constant dielectric layer 51 that is covering the thin-film traces 31 on the top surface of the substrate card 10 is of advantage because it helps to reduce the coupling between the closely spaced traces 31.

It should now be understood that the procedures of the present invention allow the substrate card to be made of a material other than alumina, such as aluminum nitride, for example. Moreover, as previously mentioned, the amount of binder used in making the tungsten paste that is placed in each of the via holes can be chosen so as to control the volume void or porosity of the sintered tungsten in the via holes and therefore the amount of copper that can reflow into the pores thereof. In this way the resulting composition of the metal mixture in the via holes can be made to have a thermal coefficient of expansion that approximately matches the material of the substrate card.

Furthermore, the procedures of the present invention permit a mixture of a number of other different metals to be used in the metal fill for the via holes, while readily enabling the matching of the thermal coefficient of expansion of the metal fill in the via holes with that of the material of the substrate card used. Thus a refractory metal such as molybdenum can be substituted for tungsten and other thermally and electrically conductive metals like Ag and Au, alone or in combination, can be substituted for the copper. In particular, the other mixtures of composite metals that can be provided to fill the via holes include Au-Ag/W, Au/W, Ag/W, Ag/Mo, Cu/Mo, Au/Mo, etc.

It should be especially noted that it is the technique of precisely drilling the via holes 12 on a dimensionally stable substrate card 10 and the filling of these via holes with a highly conductive composite, as described in connection with FIGS. 2a–2g, that makes it possible to obtain the exact pattern alignment of the via holes needed to deposit the closely positioned thin-film conductive traces 31 used to interconnect the signal vias 25a to the bonding pads 30a by the use of the photolithographic process.

From the above description, it will be apparent that there is thus provided a device of the character described possessing the particular features of advantage before enumerated as desirable, but which obviously is susceptible of modification in its form, proportion, detail construction and arrangement of parts without departing from the principle involved or sacrificing any of its advantages. It is to be understood that the invention is not limited to the specific features shown, but that the means and construction herein disclosed comprise the preferred forms of several modes of putting the invention into effect, and the invention is, therefore, claimed in any of its forms or modifications within the legitimate and valid scope of the appended claims.

What is claimed is:

1. A fine-pitch pin grid array for an IC chip having signal, ground and power contact pads on the face thereof, comprising:
    a substrate formed of a dimensionally stable electrically insulating material having an upper and lower surface;
    said substrate having signal, ground and power metal filled vias precisely positioned thereon;
    a thin-film metallization deposited on the upper surface of said substrate by use of the photolithographic process, said thin-film metallization patterned to provide signal, ground and power bonding pads to mount the IC chip and conductive traces for connecting each of the signal metal filled vias to one of the signal bonding pads;
    a multilayer metallization comprising a first dielectric layer having a low dielectric constant deposited over the thin-film metallization followed by a ground layer, a second dielectric layer having a high dielectric constant, and a power layer, said multilayer metallization patterned to extend the ground and power metal vias to contact respective ground and power layers; and
    circuit means for connecting the ground and power layers to the respective ground and power bonding pads.

2. A fine-pitch pin grid array as claimed in claim 1 wherein said circuit means for connecting the ground and power layers to the respective ground and power bonding pads is provided by further patterning said multilayer metallization to form connecting metal filled vias therebetween.

3. A fine-pitch pin grid array as claimed in claim 2 wherein the multilayer metallization is deposited above the thin-film metallization on the upper surface of the substrate by the use of thin-film techniques.

4. A fine-pitch pin grid array as claimed in claim 2 wherein the multilayer metallization is deposited above the thin-film metallization on the upper surface of the substrate by the use of thick-film techniques.

5. A fine-pitch pin grid array as claimed in claim 4 wherein the second dielectric layer is formed of a thick-film material having a dielectric constant of 100 or more.

6. A fine-pitch pin grid array as claimed in claim 4 wherein the first dielectric layer has a dielectric constant equal to about 8.

7. A fine-pitch pin grin array as claimed in claim 1 wherein the ground, second dielectric and power layers define an integrated decoupling capacitor for controlling the noise on the ground and power metal filled vias.

8. A fine-pitch pin grid array as claimed in claim 1 wherein pins are brazed to the metal filled vias on the lower surface of the substrate.

9. A fine-pitch pin grid array as claimed in claim 1 wherein the metal filled vias on the substrate comprise a porous refractory metal having a low melting conductive metal reflowed into the pores thereof.

10. A fine-pitch pin grid array as claimed in claim 1 wherein the thin-film metallization of bonding pads is deposited about the central area on the upper surface of the substrate; and
    the IC chip is mounted on the central area with its contact pads respectively wire bonded to the bonding pads.

11. A fine-pitch pin grid array as claimed in claim 1 wherein the ground layer provides for controlling the impedance of said conductive traces.

12. A substrate for a hybrid microcircuit, said substrate comprising;
    a sheet of dimensionally stable electrically insulating material having an upper surface;
    a plurality of via holes precisely drilled relative to each other on the upper surface of and extending through the sheet of dimensionally stable electrically insulating material;
    a metal filling in each of said via holes, said metal filling comprising a porous mass of sintered refractory metal having a low melting point conductive metal reflowed into the porous mass thereof; and
    a thin-film circuit precisely deposited on the upper surface of the sheet of dimensionally stable electrically insulating material such that said circuit registers with the metal fillings in the via holes.

13. A substrate for a hybrid microcircuit as claimed in claim 12 wherein the refractory metal is tungsten and the low melting point conductive metal is copper.

14. A fine-pitch pin grid array for an IC chip comprising:
    a substrate formed of a sheet of dimensionally stable electrically insulating material having an upper and lower surface;
    a plurality of via holes precisely drilled relative to each other on the upper surface of and extending through the sheet of dimensionally stable electrically insulating material;
    a metal filling in each of said via holes, said metal filling comprising a porous mass of sintered refractory metal having a low melting point conductive metal reflowed into the porous mass thereof;
    a thin-film circuit including a plurality of conductive traces precisely deposited on the upper surface of the sheet of dimensionally stable electrically insulating material such that each of the conductive traces contacts the metal filling in a respective via hole; and
    a plurality of I/O pins, each connected to the lower surface of the sheet of dimensionally stable electrically insulating material so as to contact the metal filling in a respective via hole.

15. A fine-pitch pin grid array for an IC chip as claimed in claim 14 wherein said conductive traces have a width of the order of 1 to 2 mils and a pitch of the order of 3 to 4 mils.

* * * * *